United States Patent
Okabe et al.

(10) Patent No.: US 8,382,903 B2
(45) Date of Patent: Feb. 26, 2013

(54) VAPORIZER AND SEMICONDUCTOR PROCESSING SYSTEM

(75) Inventors: Tsuneyuki Okabe, Kai (JP); Shigeyuki Okura, Kofu (JP); Kazuo Ujiie, Kawasaki (JP)

(73) Assignees: Tokyo Electron Limited, Tokyo (JP); Soken-Industries, Kawagoe (JP)

( * ) Notice: Subject to any disclaimer, the term of this patent is extended or adjusted under 35 U.S.C. 154(b) by 1243 days.

(21) Appl. No.: 11/543,086

(22) Filed: Oct. 5, 2006

(65) Prior Publication Data

US 2007/0079760 A1 Apr. 12, 2007

(30) Foreign Application Priority Data

Oct. 6, 2005 (JP) .................. 2005-293966

(51) Int. Cl.
*C23C 16/00* (2006.01)
(52) U.S. Cl. ...................................... 118/726
(58) Field of Classification Search .................. 116/726; 118/726

See application file for complete search history.

(56) References Cited

U.S. PATENT DOCUMENTS

| | | | |
|---|---|---|---|
| 5,451,260 A | 9/1995 | Versteeg et al. | |
| 6,174,371 B1 * | 1/2001 | Iseki et al. | 118/689 |
| 7,452,424 B2 * | 11/2008 | Okabe et al. | 118/726 |
| 7,883,076 B2 * | 2/2011 | Okabe et al. | 261/142 |
| 2003/0209201 A1 * | 11/2003 | Takamatsu et al. | 118/726 |
| 2004/0013800 A1 | 1/2004 | Strauch et al. | |
| 2007/0079760 A1 * | 4/2007 | Okabe et al. | 118/715 |
| 2007/0108641 A1 * | 5/2007 | Okabe et al. | 261/118 |
| 2008/0245306 A1 * | 10/2008 | Nakao et al. | 118/726 |
| 2009/0186479 A1 * | 7/2009 | Okabe et al. | 438/680 |

FOREIGN PATENT DOCUMENTS

| | | |
|---|---|---|
| CN | 1542918 A | 11/2004 |
| EP | 1 364 076 A1 | 11/2003 |
| EP | 1 364 076 B1 | 3/2007 |
| JP | 3-126872 | 5/1991 |
| JP | 6-310444 | 11/1994 |
| JP | 7-268634 | 10/1995 |
| JP | 10-308388 | 11/1998 |
| JP | 2002-173778 | 6/2002 |
| TW | 583335 | 4/2004 |
| WO | WO 02/40739 A1 | 5/2002 |

OTHER PUBLICATIONS

Machine generated English translation of JP 7-268634 published Oct. 17, 1995.*
Machine generated English translation of JP 10-308388 published Nov. 17, 1998.*
Combined Taiwanese Office Action and Search Report issued Aug. 24, 2012 in Taiwanese Patent Application No. 095137145 (with English Translation of Categories of Cited Documents).

* cited by examiner

*Primary Examiner* — Sylvia R. MacArthur
(74) *Attorney, Agent, or Firm* — Oblon, Spivak, McClelland, Maier & Neustadt, L.L.P.

(57) ABSTRACT

A vaporizer for generating a process gas from a liquid material includes a container defining a process space of the vaporizer, and an injector having a spray port configured to spray the liquid material in an atomized state downward in the container. A lower block is disposed below the spray port inside the container such that a run-up space for the atomized liquid material is defined between the spray port and the lower block, and an annular space continuous to the run-up space is defined between an inner surface of the container and the lower block. First and second heaters are respectively provided to the container and the lower block, and configured to heat the atomized liquid material flowing through the annular space to generate the process gas. A gas delivery passage is connected to the container to output the process gas from the annular space.

22 Claims, 9 Drawing Sheets

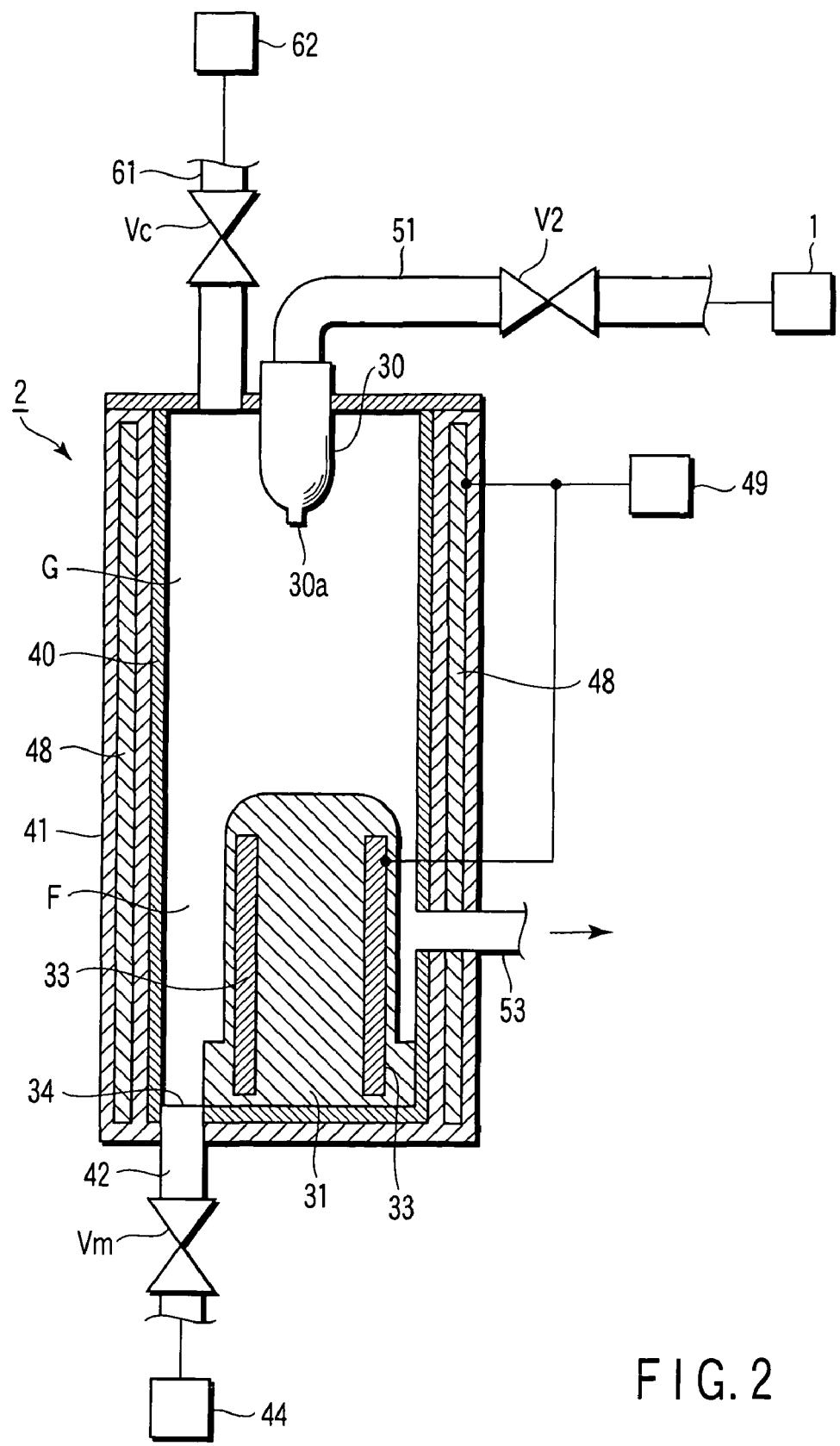
F I G. 2

VAPORIZER AND SEMICONDUCTOR PROCESSING SYSTEM

CROSS-REFERENCE TO RELATED APPLICATIONS

This application is based upon and claims the benefit of priority from prior Japanese Patent Application No. 2005-293966, filed Oct. 6, 2005, the entire contents of which are incorporated herein by reference.

BACKGROUND OF THE INVENTION

1. Field of the Invention

The present invention relates to a vaporizer for generating a process gas from a liquid material, and a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

A film formation process for forming a predetermined film on the surface of a semiconductor wafer is performed in manufacturing semiconductor devices. For example, a process of this kind is performed, using a low-pressure CVD (Chemical Vapor Deposition) apparatus. In low-pressure CVD apparatuses, a source material is supplied in a gaseous state to promote a chemical reaction, thereby depositing a thin film on the surface of a wafer. In apparatuses of this kind, there is a case where a process gas is generated by vaporizing a liquid material, and is supplied into a process chamber as a film formation gas.

Examples of a film formation process using a process gas generated by vaporizing a liquid material are as follows. Specifically, a process gas generated by vaporizing TEOS (tetraethoxysilane) and oxygen ($O_2$) gas are used to form an $SiO_2$ film. A process gas generated by vaporizing $Si_2Cl_6$ and ammonia ($NH_3$) gas are used to form a silicon nitride ($Si_3N_4$) film.

Patent Document 1 (Jpn. Pat. Appln. KOKAI Publication No. 3-126872 (Page 3, Paragraph number 30, and FIG. 1)) discloses one type of a vaporizer for vaporizing a liquid material. According to this vaporizer, an atomized liquid material is supplied from a nebulizer into a vaporizing chamber heated at a predetermined temperature, and is vaporized there. However, this vaporizer cannot provide a sufficient heat exchange when the atomized liquid material flows through the vaporizing chamber. Consequently, the process gas obtained at the output pipe of the vaporizing chamber contains a lot of mist. Where the process gas is supplied into the reaction chamber of, e.g., a low-pressure CVD apparatus, the mist is deposited on the surface of a wafer and generates particles. Thus, the mist is a cause of particle generation on the wafer.

Patent Document 2 (Jpn. Pat. Appln. KOKAI Publication No. 6-310444 (Paragraph number 0123 and FIG. 13)) discloses another type of a vaporizer for vaporizing a liquid material. According to this vaporizer, a plurality of vaporizing plates with a heater built therein are disposed in a vaporizing chamber perpendicularly to the inner wall thereof so as to interfere with flows of the liquid material. The atomized liquid material collides with the vaporizing plates and is vaporized thereby. However, this vaporizer entails gas dead volumes at the proximal ends of the vaporizing plates (on the vaporizer sidewall). In the dead volumes, the atomized liquid material does not collide with the vaporizing plate but accumulates to generate mist. Consequently, it is difficult to completely prevent mist generation.

BRIEF SUMMARY OF THE INVENTION

An object of the present invention is to provide a vaporizer that can vaporize a liquid material with high efficiency. Another object of the present invention is to provide a semiconductor processing system that can perform a process with high efficiency.

According to a first aspect of the present invention, there is provided a vaporizer for generating a process gas from a liquid material, the vaporizer comprising:
a container defining a process space of the vaporizer;
an injector having a spray port configured to spray the liquid material in an atomized state downward in the container;
a lower block disposed below the spray port inside the container such that a run-up space for the atomized liquid material is defined between the spray port and the lower block, and an annular space continuous to the run-up space is defined between an inner surface of the container and the lower block;
first and second heaters respectively provided to the container and the lower block, and configured to heat the atomized liquid material flowing through the annular space to generate the process gas; and
a gas delivery passage connected to the container to output the process gas from the annular space.

According to a second aspect of the present invention, there is provided a semiconductor processing system comprising:
a process chamber configured to accommodate a target substrate;
a support member configured to support the target substrate inside the process chamber;
a heater configured to heat the target substrate inside the process chamber;
an exhaust system configured to exhaust gas inside the process chamber; and
a gas supply system configured to supply a process gas into the process chamber, and including a vaporizer for generating a process gas from a liquid material,
wherein the vaporizer comprises
a container defining a process space of the vaporizer,
an injector having a spray port configured to spray the liquid material in an atomized state downward in the container,
a lower block disposed below the spray port inside the container such that a run-up space for the atomized liquid material is defined between the spray port and the lower block, and an annular space continuous to the run-up space is defined between an inner surface of the container and the lower block,
first and second heaters respectively provided to the container and the lower block, and configured to heat the atomized liquid material flowing through the annular space to generate the process gas, and
a gas delivery passage connected to the container to output the process gas from the annular space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a sectional side view showing a vaporizer used in the system shown in FIG. 1;

DETAILED DESCRIPTION OF THE INVENTION

Figure 1:
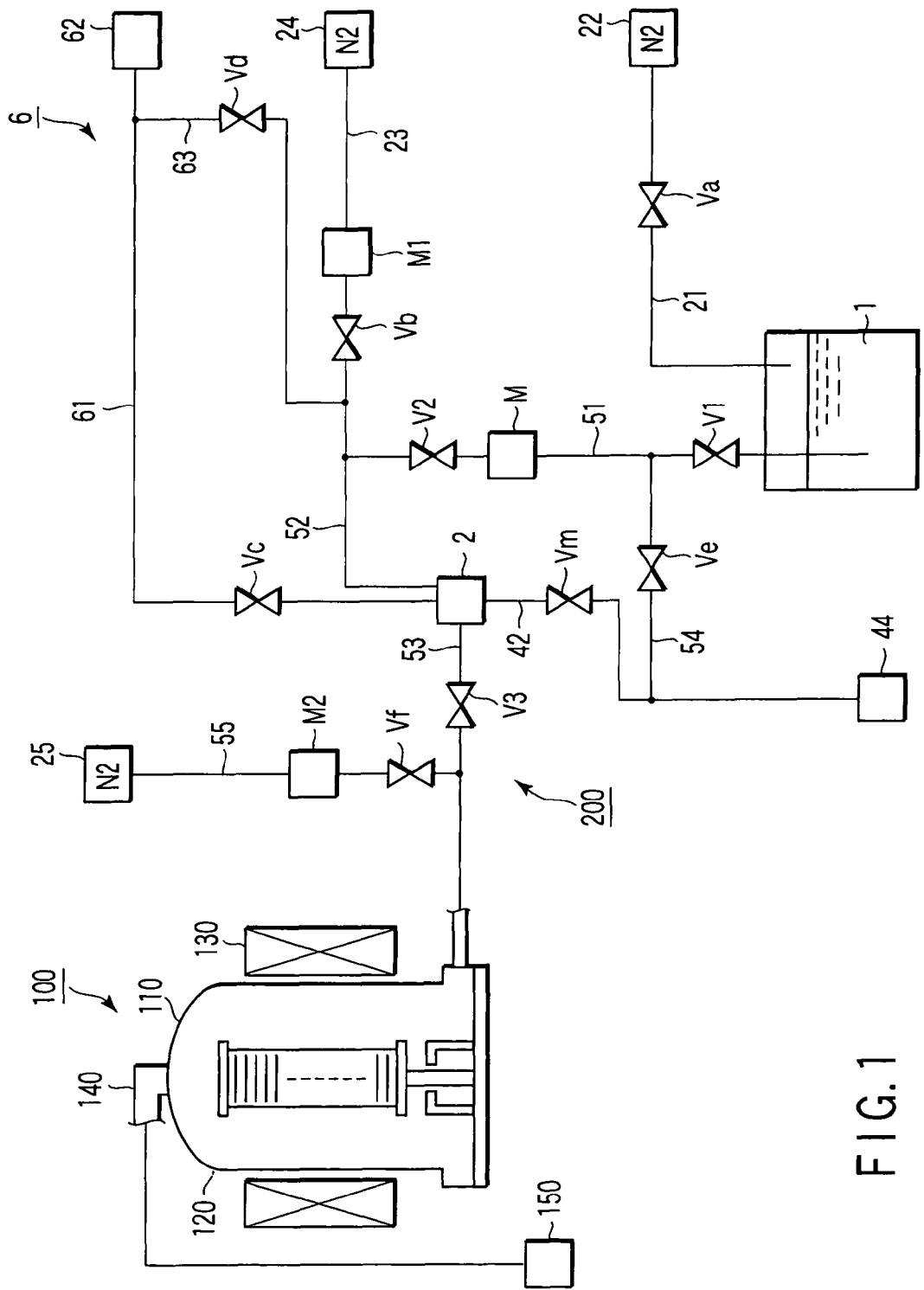
FIG. 1 is a structural view showing a semiconductor processing system (film formation system) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a structural view showing a semiconductor processing system (film formation system) according to an embodiment of the present invention. As shown in FIG. 1, this system includes a film formation section configured to perform a predetermined film formation process on target substrates, such as wafers W, (to form a predetermined thin film on the wafers W). The film formation section 100 is connected to a gas supply system 200 configured to supply a predetermined process gas.

For example, the film formation section 100 comprises a low-pressure CVD apparatus of the batch type having a vertical reaction tube 110 used as a reaction chamber (process chamber). A wafer boat 120 supporting a number of wafers W can be loaded and unloaded into and from the reaction tube 110. A heater 130 is disposed around the reaction tube 110 to heat the wafers W. A vacuum pump 150 used as vacuum exhaust means is disposed to maintain the interior of the reaction tube 110 at a predetermined vacuum level. A predetermined process gas is supplied into the reaction tube 110 through a process gas supply line, as described later.

The gas supply system 200 includes a storage vessel 1, a vaporizer 2, and piping lines connected to them. The storage vessel 1 stores a liquid material having a low vapor pressure of, e.g., 0.55 Pa at 85° C., such as a hafnium-based material, e.g., TEMAH (Tetrakis (N-ethyl-N-methylamino) hafnium) or HTB (hafnium tetra-t-butoxide). The vaporizer 2 is configured to vaporize a liquid material supplied from the storage vessel 1, so as to generate the process gas.

Specifically, the storage vessel 1 is connected to the vaporizer 2 through a supply line (liquid material supply passage) 51. The end of the supply line 51 at the storage vessel 1 is positioned in the liquid material within the storage vessel 1. The supply line 51 is provided with a first valve V1, a liquid mass flow meter M, and a second valve V2 in this order from the upstream side (from the storage vessel 1).

A gas supply line 21 provided with a valve Va is connected to the storage vessel 1. One end of the gas supply line 21 is positioned above the surface of the liquid material within the storage vessel 1. The other end of the gas supply line 21 is connected to a supply source 22 of a pressurized gas, such as $N_2$ gas. When the liquid material is supplied from the storage vessel 1 to the vaporizer 2, the storage vessel 1 is supplied with $N_2$ gas in an amount of, e.g., about $1.0\,kg/cm^2$. The liquid material is sent and transported by the pressure from the storage vessel 1 to the vaporizer 2 at a predetermined flow rate. The pressurized gas may be an inactive gas, such as helium (He) gas or argon (Ar) gas other than $N_2$ gas.

A supply source 24 of an assist gas used as a purge gas or atomizing gas, such as $N_2$ gas, is also connected to the vaporizer 2 through a gas supply line 23. The gas supply line 23 is provided with a first mass flow controller M1 and a valve Vb in this order from the gas supply source 24. With this arrangement, the assist gas or $N_2$ gas can be supplied to the vaporizer 2 at a predetermined flow rate. The assist gas may be an inactive gas, such as helium (He) gas or argon (Ar) gas other than $N_2$ gas.

Figure 3A:
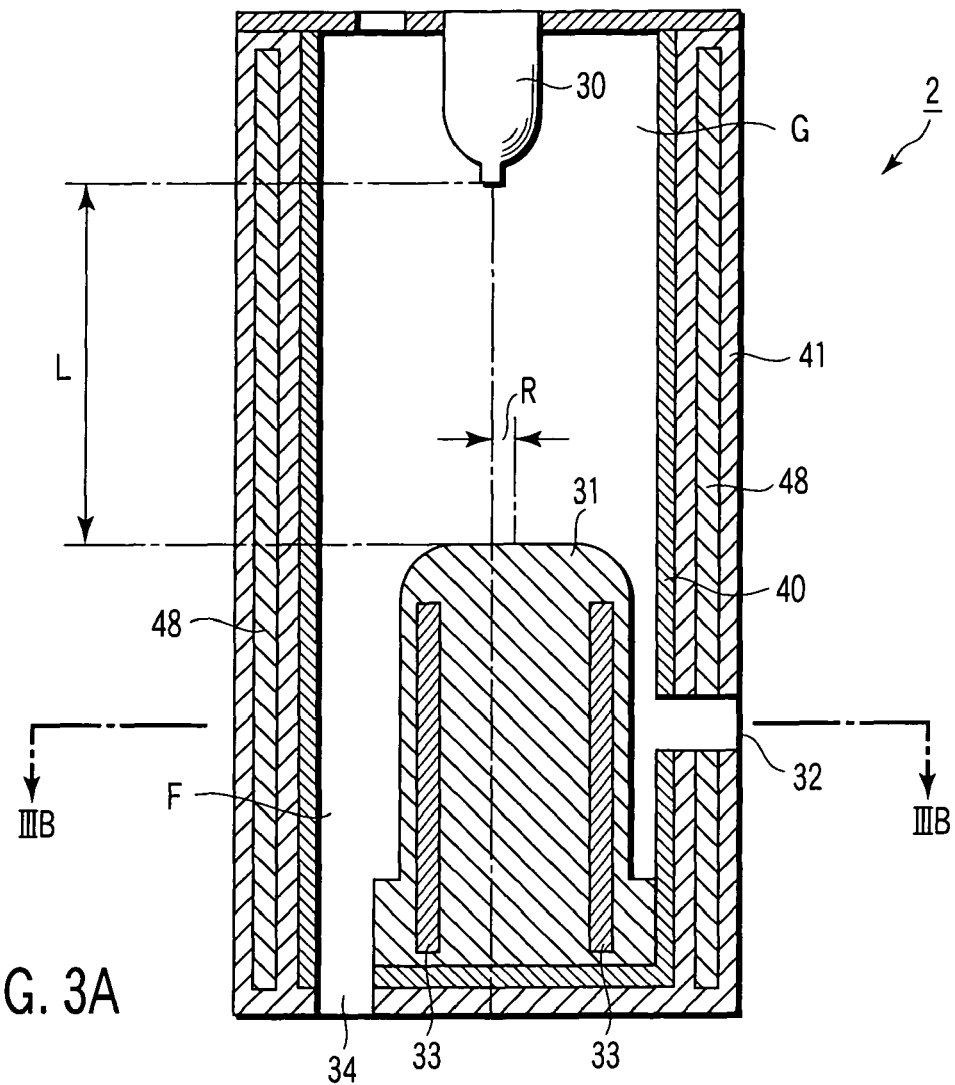
FIG. 3A is a sectional side view showing the inside of the vaporizer shown in FIG. 2.
Figure 3B:
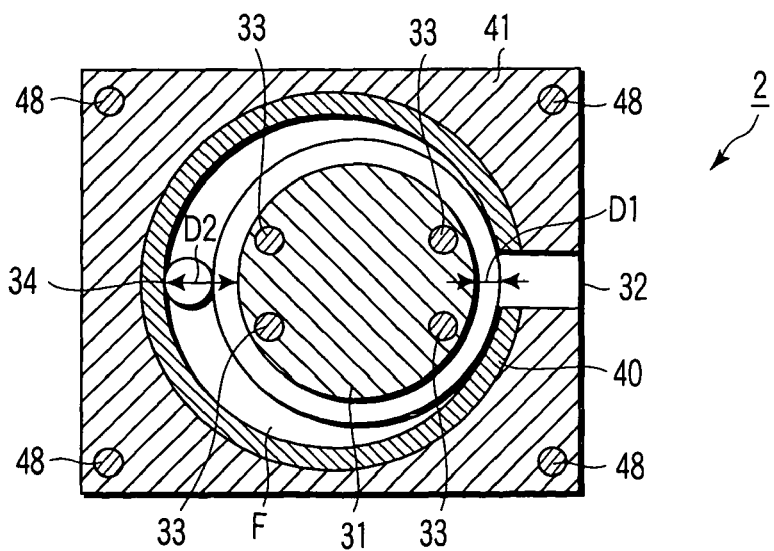
FIG. 3B is a sectional plan view taken along a line IIIB-IIIB in FIG. 3A.

FIG. 2 is a sectional side view showing the vaporizer 2 used in the system shown in FIG. 1. FIG. 3A is a sectional side view showing the inside of the vaporizer 2 shown in FIG. 2. FIG. 3B is a sectional plan view taken along a line IIIB-IIIB in FIG. 3A. The vaporizer 2 includes a cylindrical airtight container 40 used as a unit body for defining a vaporizer process space, and a rectangular cover 41 covering the outer surface of the container 40. The container 40 is formed of a vertical cylinder of stainless steel, which has an inner diameter of 30 to 40 mm and a length of 250 mm, for example. An injector 30 is disposed on the central axis of the container 40 at the top, and is connected to the supply line 51. The injector 30 is of a spray-type having a double tube structure formed of inner and outer tubes. The inner tube discharges a liquid material supplied from the supply line 51, while the outer tube discharges nitrogen gas used as an atomizing gas supplied from the supply line 23. The liquid material is delivered into the container 40 from a spray port 30a (having a hole diameter of, e.g., 0.1 mm) at the distal end of the injector 30 in an atomized state (as mist).

As shown in FIG. 3A, a cylindrical lower block 31 having a smaller diameter than the container 40 is disposed on the bottom of the container 40. A run-up space G is defined between the injector 30 and the lower block 31 and has a distance L of, e.g., about 20 to 200 mm, to further uniformly atomize the atomized liquid material from the injector 30. The center of the lower block 31 is offset from the center of the injector 30 toward one side by a distance R of, e.g., 1 to 4 mm. On this side, as described later, an output port 32 is formed near the bottom of the container 40 to output the process gas from the vaporizer 2. With this arrangement, an annular space F is defined between the inner surface of the container 40 and the lower block 31. As shown in FIG. 3B, the width of the annular space F (the width shown in the plan view of the vaporizer 2) is arranged such that a width D1 on the output port 32 side is smaller than a width D2 on the side opposite thereto. The width ratio D2/D1 of the annular space F is set to be preferably of 3 to 1, and more preferably of 2 to 1.5.

As shown in FIGS. 3A and 3B, the cover 41 contains a plurality of heaters 48 formed of resistive heating bodies, which are disposed to extend in, e.g., the longitudinal direction of the container 40 and surround the container 40. In this embodiment, the heaters 48 consist of two heaters disposed near the output port 32 and two heaters disposed near the opposite side to the output port 32. These heaters 48 are respectively connected to a power supply section 49. For example, the heaters 48 are controlled for heating by a common temperature controller. Alternatively, the heaters 48 may be controlled for heating such that a set of two heaters on the output port 32 side is controlled independently of a set of two heaters on the opposite side. Alternatively, the heaters 48 may be controlled for heating such that the four heaters are controlled independently of each other.

The container 40 has the output port 32 formed in the sidewall near the bottom to output the process gas generated by vaporization of the liquid material. The container 40 further has a drain port 34 formed in the bottom to exhaust non-vaporized part of the liquid material. As shown in FIG. 3B, the drain port 34 is formed in the bottom of the container 40 at a position facing the gap between the lower block 31 and the sidewall of the container 40 opposite to the output port 32. The drain port 34 is connected to a discharge line 42, which is provided with a mist exhaust valve Vm near the bottom of the container 40. When the valve Vm is closed, a mist receiver is formed near the drain port 34 to store mist. The other end of the discharge line 42 is connected to an exhaust pump 44 to suck and exhaust mist, so a suction passage is defined by the discharge line 42 and exhaust pump 44.

As shown in FIGS. 3A and 3B, the lower block 31 contains a plurality of heaters 33 formed of resistive heating bodies, which are disposed to extend in, e.g., the longitudinal direction of the lower block 31 and arrayed in the annular direction at intervals. In this embodiment, the heaters 33 consist of two heaters disposed near the output port 32 and two heaters disposed near the opposite side to the output port 32. These heaters 33 are respectively connected to the power supply section 49. For example, the heaters 33 are controlled for heating by a common temperature controller. Alternatively, the heaters 33 may be controlled for heating such that a set of two heaters on the output port 32 side is controlled independently of a set of two heaters on the opposite side. Alternatively, the heaters 33 may be controlled for heating such that the four heaters are controlled independently of each other.

Further, a supply section 6 for supplying a cleaning solution into the container 40 is connected to the vaporizer 2 to clean up the interior of the container 40. The supply section 6 includes a cleaning solution vessel 62 for storing the cleaning solution, which is connected to the top of the container 40 through a supply line 61 provided with a valve Vc. The cleaning solution is a solvent, such as an alcohol family solution, e.g., ethanol or hexane, which dissolves the liquid material and solidified liquid material. The cleaning solution is supplied from the cleaning solution vessel 62 through the supply line 61 into the container 40. The cleaning solution is discharged through the discharge line 42 when the valve Vm is opened.

The vaporizer 2 is connected to the reaction tube 110 of the film formation section 100 through a supply line (process gas supply line) 53 provided with a third valve V3, as described above. In order to guide the process gas to the film formation section 100 while preventing it from being re-liquefied, the distance from the third valve V3 to the film formation section 100 is set to be short, such as about 50 to 100 cm. In practice, the upstream side of the supply line 53 from the third valve V3 is very short, such that the third valve V3 is attached to the outlet of the vaporizer 2. Otherwise, the upstream side from the third valve V3 becomes a dead zone, where mist remains. Further, a nitrogen gas supply source 25 is connected to the supply line 53 downstream from the valve V3, through a supply line 55 provided with a valve Vf and a mass flow controller M2.

The gas supply system 200 may have a branch line 63 provided with a valve Vd, one end of which is connected to the supply line 61, and the other end is connected to the gas supply line 23 between the valve Vb and vaporizer 2. The gas supply system 200 may also have a branch line 54 provided with a valve Ve, one end of which is connected to the supply line 51 between the first valve V1 and liquid mass flow meter M, and the other end is connected to the discharge line 42 downstream from the valve Vm.

Figure 4:
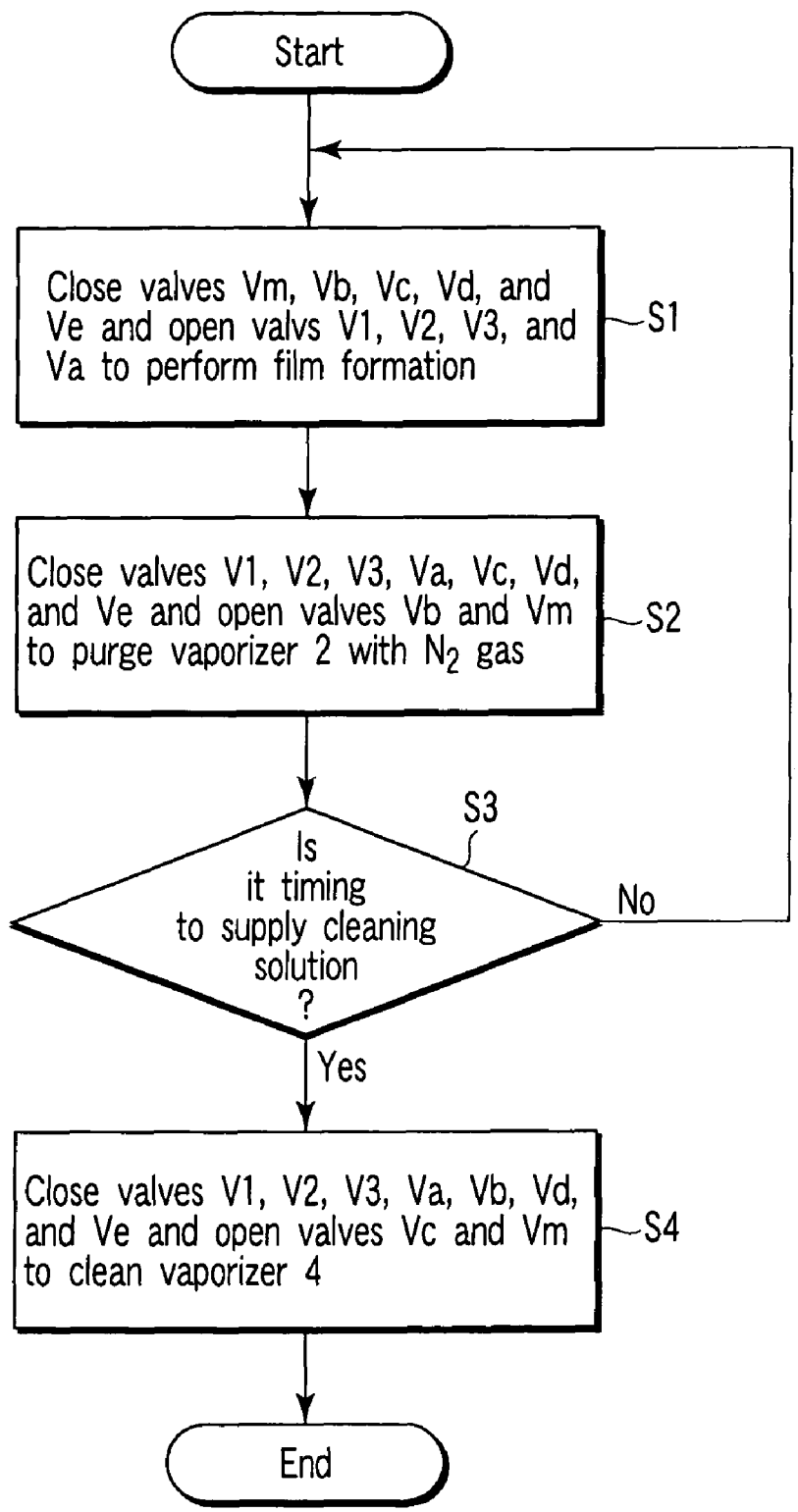
FIG. 4 is a flow chart showing a film formation method according to an embodiment of the present invention.

FIG. 4 is a flow chart showing a film formation method according to an embodiment of the present invention. According to this method, a film formation process (step S1) is first performed while the valves Vm, Vb, Vc, Vd, and Ve are set closed, and the valve V1, V2, V3, and Va are set open.

Specifically, the gas supply system 200 is operated such that $N_2$ gas used as a pressurized gas is supplied into the storage vessel 1 through the gas supply line 21. With this pressurized gas being supplied, the liquid material having a low vapor pressure, such as hafnium-based material, is sent by pressure from the storage vessel 1 through the supply line 51 to the vaporizer 2, at a flow rate controlled by the liquid mass flow meter M. At this time, the temperature of the liquid material flowing through the supply line 51 is set at, e.g., about 40° C. by a heater (not shown) disposed around the supply line 51.

On the other hand, in the film formation section 100, the interior of the reaction tube 110 is vacuum-exhausted to a predetermined vacuum level. Thus, the fluids can flow downstream through supply lines in the gas supply system 200 when the corresponding valves are opened. Thus, the vaporizer 2 is supplied with the liquid material or hafnium-based material at a flow rate of, e.g., 5 sccm. At this time, the valve V3 of the output port 32 is set open, while the valve Vm of the drain port 34 is set closed, so a fluid flow bent from a vertical direction to a horizontal direction is formed within the container 40.

Figure 5:
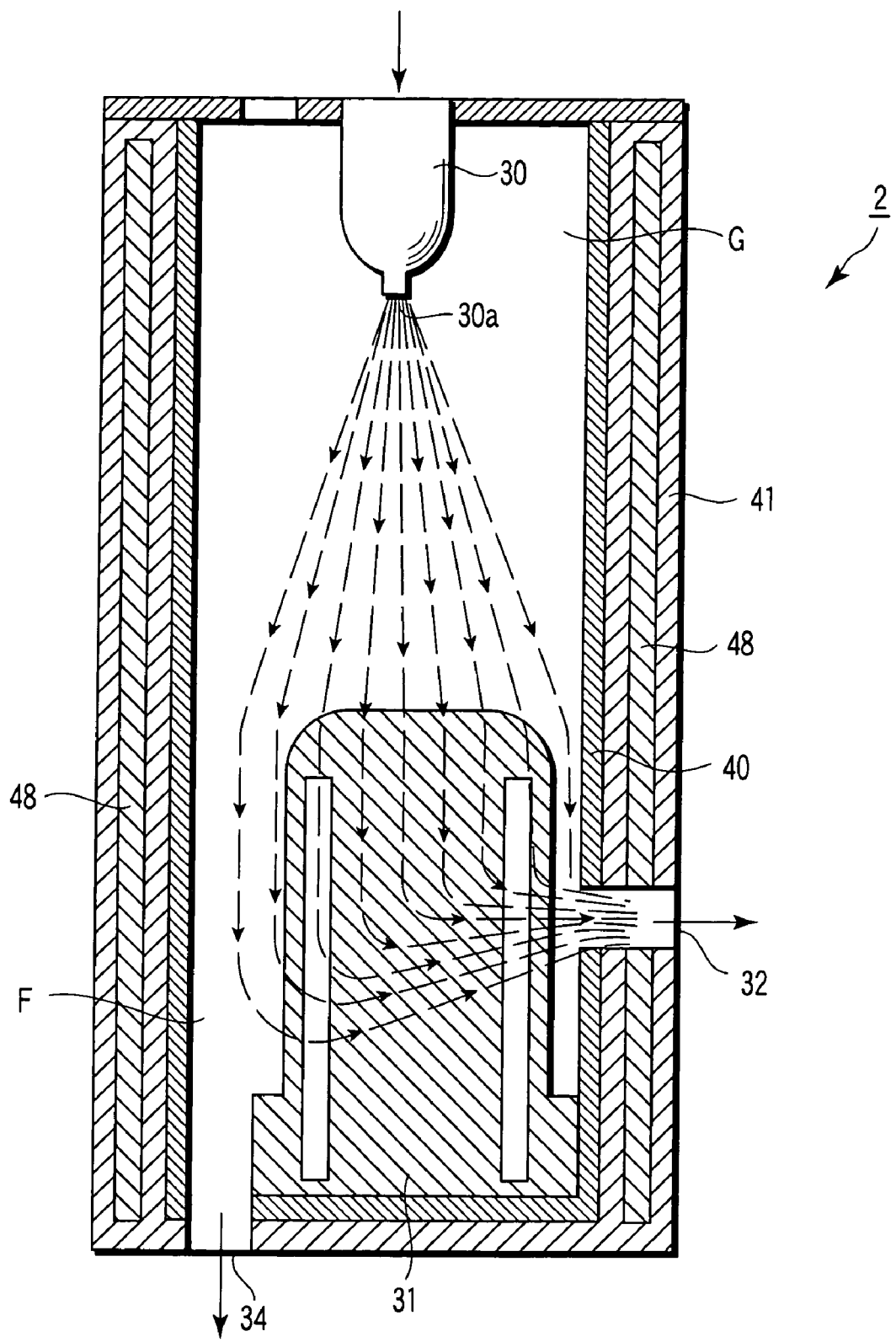
FIG. 5 is a sectional view showing an image of vaporization of a liquid material performed in the vaporizer shown in FIG. 2.

FIG. 5 is a sectional view showing an image of vaporization of a liquid material performed in the vaporizer 2 shown in FIG. 2. In the vaporizer 2, the interior of the container 40 is heated by the heaters 33 and 48 at, e.g., about 80° C. The liquid material is delivered downward from the injector 30 into the container 40 in an atomized state (as micro-particles). The atomized liquid material is further uniformly atomized and partly vaporized by heating, while it is spreading conically in the run-up space G defined at the upper side within the container 40. This conical flow of the atomized liquid material containing mist and vapor then collides with the lower block 31. Consequently, the flow of the atomized liquid material is expanded by the lower block 31 that enters the center of the flow, and then is guided into the annular space F formed between the inner surface of the container 40 and the lower block 31.

Figure 6A:
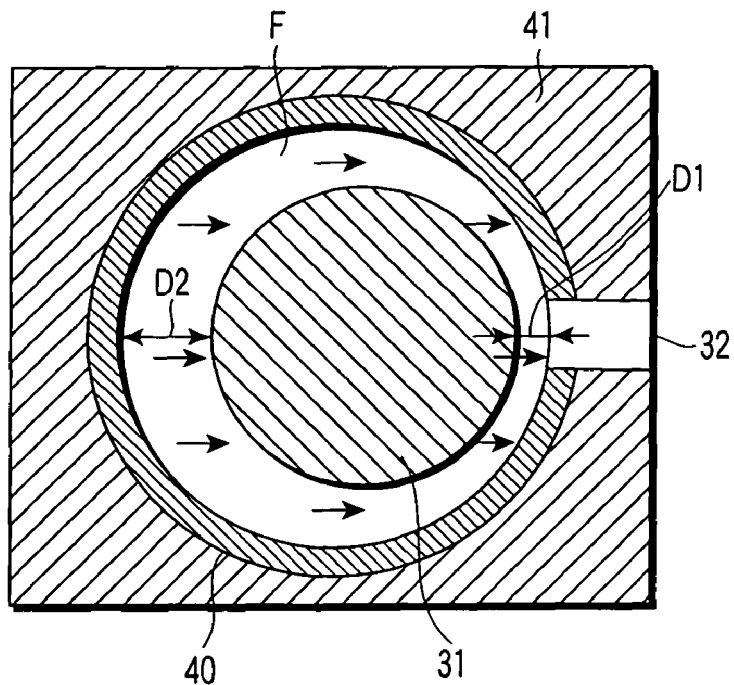
FIG. 6A is a view showing the distribution of gas flow velocity in an annular space formed in the vaporizer shown in FIG. 2.

FIG. 6A is a view showing the distribution of gas flow velocity in the annular space F formed in the vaporizer 2 shown in FIG. 2. As described above, the annular space F is arranged such that the width D1 on the output port 32 side is smaller than the width D2 on the side opposite thereto. In this case, as shown in FIG. 6A, even where a negative pressure is generated at the output port 32 due to a sucking force through the supply line 53, the pressure difference in the annular space F between the output port 32 side and the opposite side is small, and the pressure inside the annular space F can be thereby almost uniform. Consequently, the atomized liquid material, which has been partly vaporized in the run-up space G, is heated in the annular space F while it is uniformly flowing therethrough. This makes it possible to efficiently vaporize the atomized liquid material to generate the process gas.

The process gas flowing downward in the annular space F can change direction to the horizontal direction by a sucking force through the output port 32, and flow into the supply line 53. On the other hand, the mist mixed within the process gas does not change direction, but flows downward due to an inertia force based on its own large weight. Consequently, the mist is separated from the process gas and reaches the bottom of the container 40. The mist is accumulated and agglomerated to change into a liquid phase at the bottom of the container 40, and then flows toward the drain port 34 (the valve Vm is set closed). Since the drain port 34 is formed at a position lower than the output port 32, no drainage liquid flows into the output port 32.

Figure 6B:
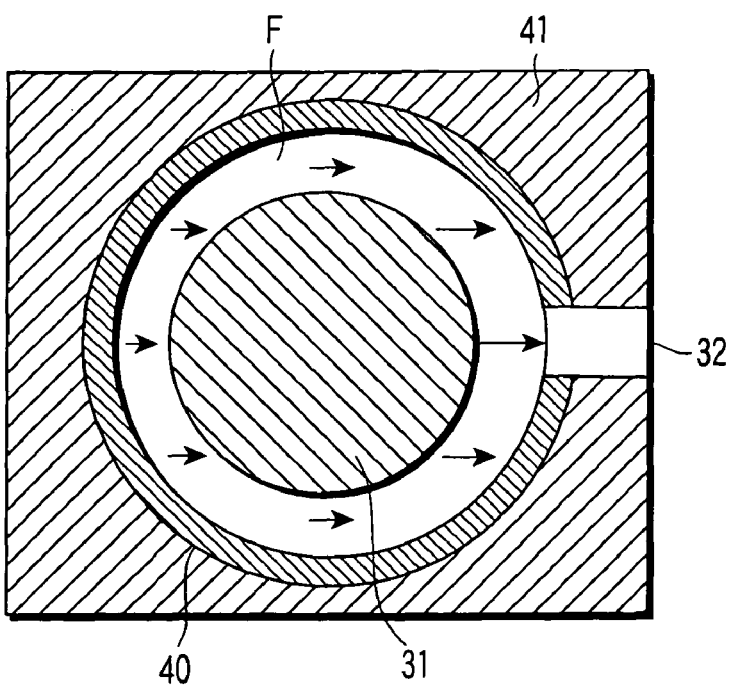
FIG. 6B is a view showing the distribution of gas flow velocity in an annular space according to a comparative example.

FIG. 6B is a view showing the distribution of gas flow velocity in an annular space F according to a comparative example. In this comparative example, the lower block 31 is disposed at the center of the container 30. In this case, as shown in FIG. 6B, due to a sucking force through the output port 32, the pressure difference in the annular space F between the output port 32 side and the opposite side becomes larger, and the pressure inside the annular space F can be thereby less uniform. In this case, the atomized liquid material cannot uniformly flow through the annular space F, thereby decreasing the vaporization efficiency. Although the present invention covers such a case, but the lower block 31 is preferably offset toward the output port 32 side, as shown in FIG. 6A.

The process gas thus generated is supplied through the supply line 53 into the film formation section 100. At this time, the temperature of the process gas flowing through the supply line 53 is set at, e.g., about 80° C. by a heater (not shown) disposed around the supply line 53.

On the other hand, in the film formation section 100, a predetermined number of wafers W are placed on the boat 120, in advance. The boat 120 is loaded into the reaction tube 110 set at a predetermined temperature, and the interior of the reaction tube 110 is vacuum-exhausted to a predetermined vacuum level. After the interior of the reaction tube 110 is stabilized at a predetermined temperature and a predetermined pressure, the process gas generated by vaporization, such as a hafnium-based material, and oxygen gas (not shown) are supplied into the reaction tube 110. Under these conditions, a film formation process is performed to form a hafnium oxide film on the wafers W.

After the film formation process is finished, a purge process of the vaporizer 2 is performed (step S2). At this time, the exhaust pump 44 is operated while the valves V1, V2, V3, Va, Vc, Vd, and Ve are set closed, and the valves Vb and Vm are set open. $N_2$ gas used as a purge gas is supplied from the gas supply source 24 through the gas supply line 23 into the vaporizer 2, and then is exhausted from the discharge line 42.

The interior of the vaporizer 2 is thus purged with $N_2$ gas, so that the residual liquid material within the vaporizer 2 is completely removed. Consequently, the reproducibility of the process is improved, and less particles are generated. This purge process may be performed every time the film formation process is performed at the film formation section 100, or every several times the film formation process is performed, i.e., periodically.

After the film formation process is finished, a purge process of a portion of the supply line 53 downstream from the third valve V3 may be performed. In this purge process, the valve Vf is opened and the reaction tube 110 is exhausted by the vacuum pump 150. Further, nitrogen gas is supplied from the nitrogen gas supply source 25 through the supply line 55 into the portion of the supply line 53 downstream from the third valve V3, at a flow rate controlled by the mass flow controller M2. Under these conditions, deposited substances on the inner wall of the supply line 53, such as residual substances of the process gas and solid components formed by denaturing of the process gas, are pushed away and removed through the film formation section 100. This purge process may be performed every time the film formation process is performed at the film formation section 100, or every several times the film formation process is performed, i.e., periodically.

After the vaporizer 2 is purged with $N_2$ gas, judgment is made as to whether it is time to perform cleaning of the vaporizer 2 with a cleaning solution (step S3). If it is not time to perform this cleaning, this flow returns back to the step S1. If it is time to perform this cleaning, this flow proceeds to a step S4. For example, this cleaning of the vaporizer 2 is periodically performed every predetermined number of times the film formation process is performed at the film formation section 100.

In this cleaning of the vaporizer 2 with a cleaning solution, the exhaust pump 44 is operated while the valves V1, V2, V3, Va, Vb, Vd, and Ve are set closed, and the valves Vc and Vm are set open. Under these conditions, the mist stored in the container 40 is discharged from the container 40 through the discharge line 42, while the cleaning solution is supplied into the vaporizer 2 through the supply line 61. Since the cleaning solution is a solvent that dissolves the liquid material and solidified liquid material, even if mist has been partly re-liquefied or denatured to solid components, they are dissolved by the cleaning solution and removed, while mist deposited on the inner wall of the container 40 of the vaporizer 2 is washed away.

In the cleaning process, the exhaust pump 44 may be operated while the valves V2, Vd, and Ve are set open. Under these conditions, the cleaning solution is caused to flow through the branch line 63, liquid mass flow meter M, supply line 51, branch line 54, and discharge line 42, so as to remove deposited substances on the inner walls of these members, such as the liquid material and solidified components of the liquid material.

As described above, according to the vaporizer 2, the atomized liquid material is delivered downward from the injector 30, and is then further uniformly atomized and partly vaporized by heating in the run-up space G. Subsequently, the atomized liquid material is expanded by the lower block 31, and then flows through the annular space F while it is heated by a sufficient heat exchange. Since the annular space F entails no gas dead volumes, the atomized liquid material can be reliably vaporized with high vaporization efficiency. With this arrangement, the process gas (vaporized liquid material) containing the least mist can be supplied into the film formation section 100, so wafers are protected from particle deposition. Further, where a water vapor process is performed in the film formation section, wafers are protected from water mark generation due to water droplets.

Furthermore, for example, every time the film formation process is performed, or every predetermined number of times the film formation process is performed, the purge gas is supplied from the gas supply line 23 through the vaporizer 2, so that any liquid material remaining in these portions is removed. Consequently, when the subsequent lot is processed, the interior of these portions is in a dried state with no deposited substances therein, thereby improving the process reproducibility. In this case, the purge gas is supplied into the vaporizer 2 through a supply route different from that for the film formation section 100. The areas to be purged are thus limited only to the vaporizer 2 and portions around it, so that these portions are efficiently purged to completely remove deposited substances therein in a short time. Further, the space of the supply line 53 between the valve V3 and film formation section 100 is set to be small, so that deposited substances in this space can be efficiently discharged by exhausting the film formation section 100 by the vacuum pump 150.

Furthermore, after mist is removed from the vaporizer 2 by suction with a predetermined timing, cleaning inside the vaporizer 2 is performed. Thus, after mist is discharged, mist and denatured mist sticking inside the container 40 and near the mist receiver is further removed. Consequently, when the subsequent lot is processed, the interior of the vaporizer 2 has no deposited substances therein, thereby preventing particles from being generated and improving the process reproducibility.

Figure 7:
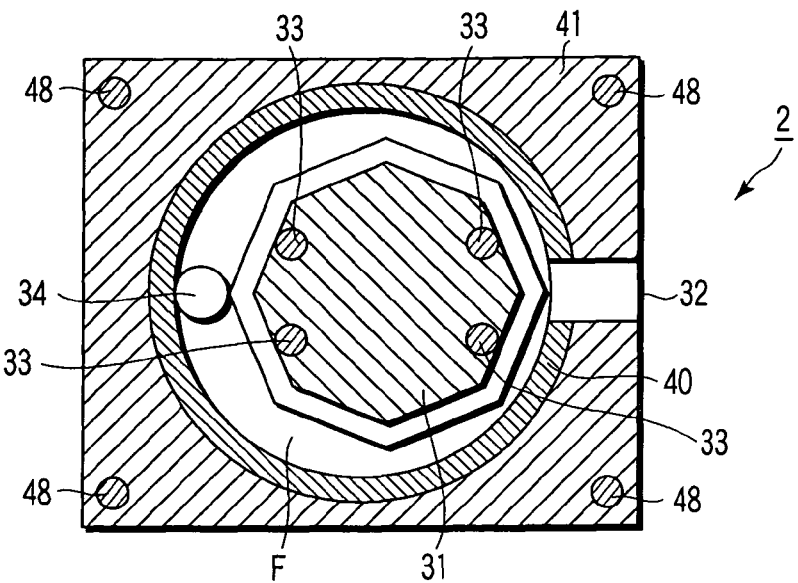
FIG. 7 is a sectional plan view showing a modification of the vaporizer shown in FIG. 2.

FIG. 7 is a sectional plan view showing a modification of the vaporizer 2 shown in FIG. 2. In this modification, a lower block 31 having a polygonal shape in the cross section is disposed in a container 40. This arrangement can also provide the same effect described above.

Figure 8:
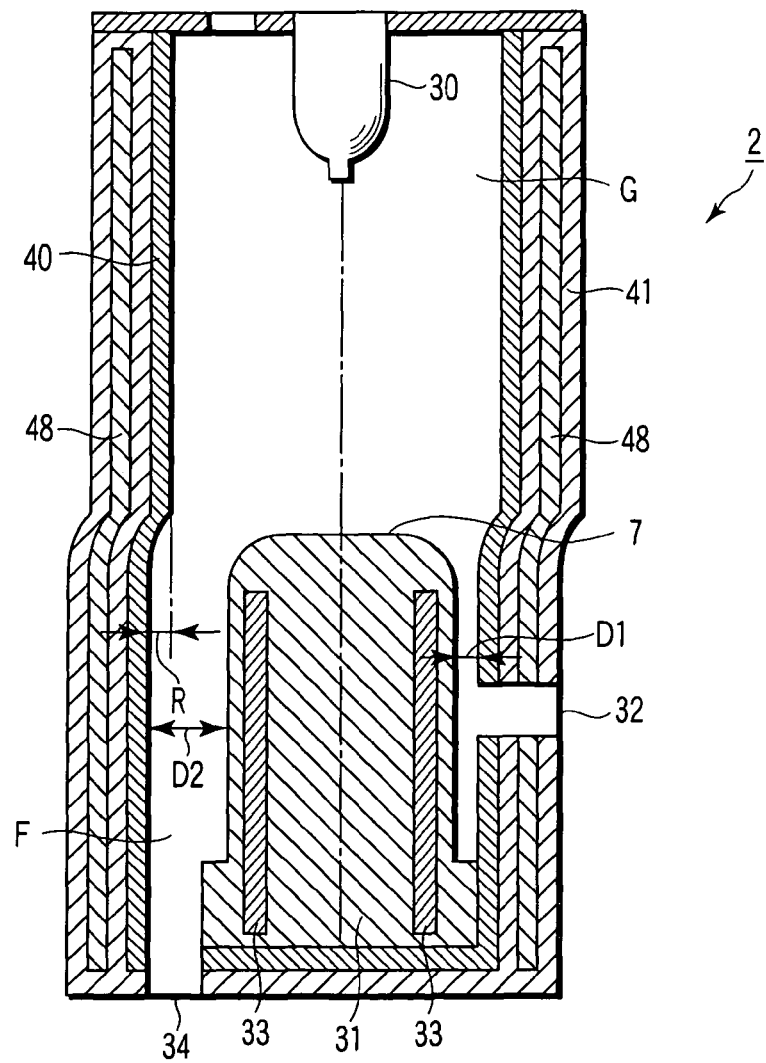
FIG. 8 is a sectional side view showing another modification of the vaporizer shown in FIG. 2.

FIG. 8 is a sectional side view showing another modification of the vaporizer 2 shown in FIG. 2. In the structure shown in FIG. 2, the center of the lower block 31 is offset from the center of the injector 30 toward the output port 32 by a distance R. This arrangement is intended to set the annular space F such that the width D1 on the output port 32 side is smaller than the width D2 on the side opposite thereto. However, in the modification shown in FIG. 8, the center of the lower block 31 aligns with the center of the injector 30, while the sidewall of the container 40 is curved from a position corresponding to the top of the lower block 31. With this arrangement, the annular space F is arranged such that the width D1 on the output port 32 side is smaller than the width D2 on the side opposite thereto. This arrangement can also provide the same effect described above.

In the present invention, the liquid material having a low vapor pressure may be $Ta(OC_2H_5)_5$, which has a vapor pressure of 40 Pa or less at 140° C., or TDEAH $(HF[N(C_2H_5)]_4)$, which has a vapor pressure of 40 Pa or less at 120° C., other than a hafnium-based material or HEAD. The present invention may be applied to a process of using a process gas generated by vaporizing HEAD along with $NH_3$ gas to form a silicon nitride film, and a process of using a process gas generated by vaporizing $Ta(OC_2H_5)_5$ along with $O_3$ gas to form a $Ta_2O_5$ film. The film formation section may employ a film formation apparatus of the single-substrate type other than a low-pressure CVD apparatus of the batch type.

Figure 9:
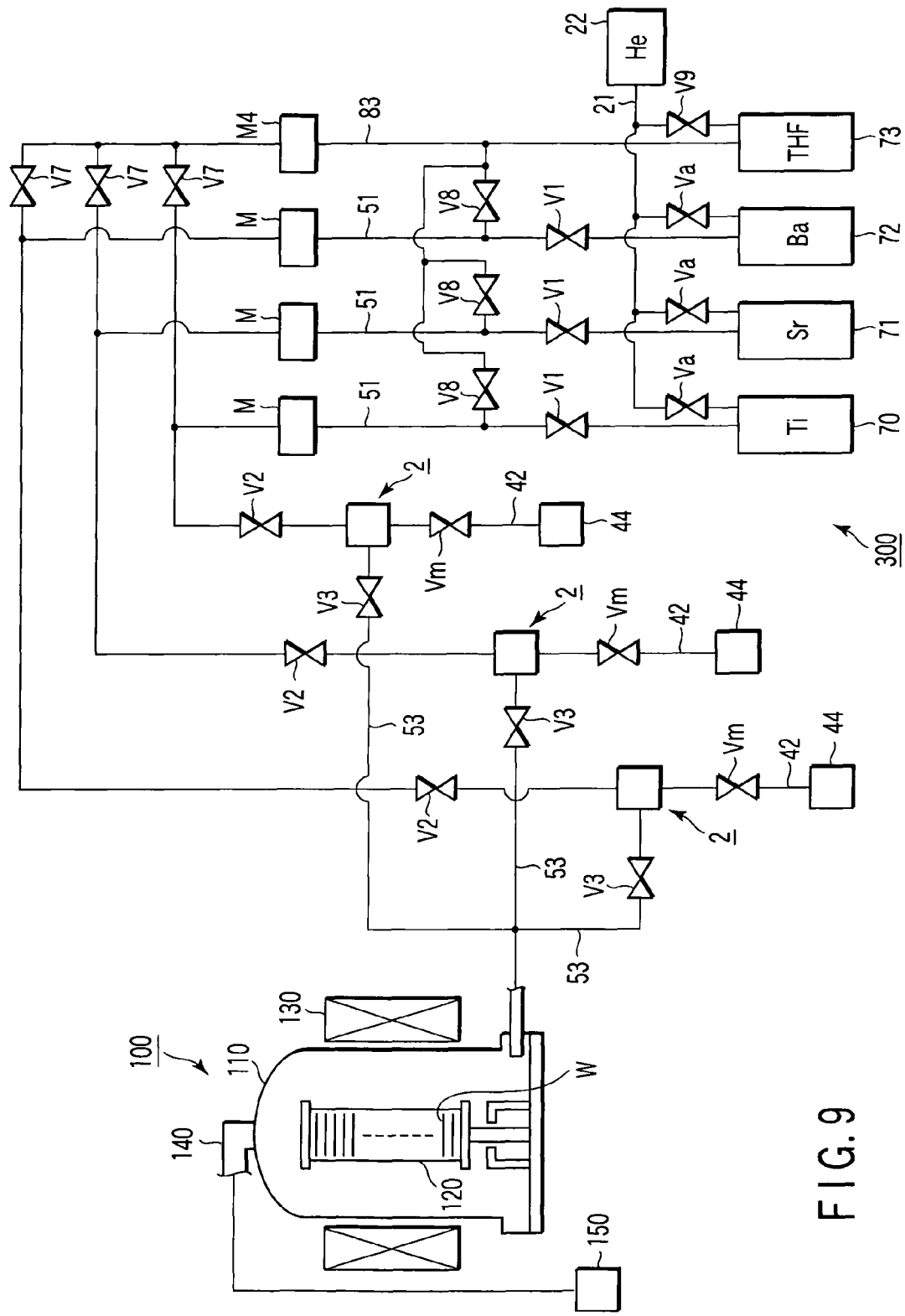
FIG. 9 is a structural view showing a semiconductor processing system (film formation system) according to another embodiment of the present invention.

FIG. 9 is a structural view showing a semiconductor processing system (film formation system) according to another embodiment of the present invention. This embodiment includes a gas supply system 300 configured to supply a plurality of different process gases into the reaction tube 110 of a film formation section 100. For this purpose, the gas supply system 300 includes a plurality of storage vessels respectively for storing different liquid materials, and a plurality of vaporizers for respectively generating different process gases from the liquid materials.

Specifically, the film formation section 100 is arranged to form a metal oxide film with a high dielectric constant, which contains, e.g., barium (Ba), strontium (Sr), and titanium (Ti), on the surface of wafers W supported on a wafer boat 120 inside the reaction tube 110. Accordingly, the gas supply system 300 includes storage vessels 70, 71, and 72 that store liquid materials respectively prepared by dissolving organic substances of titanium (Ti), strontium (Sr), and barium (Ba), i.e., metal organic substances, with tetrahydrofuran (THF) solution. The storage vessels 70, 71, and 72 are respectively connected to their own dedicated vaporizers 2. These vaporizers 2 respectively have output ports 32 connected to gas supply lines 53, which are combined in front of the film formation section 100 into one line connected to film formation section 100. Each of the liquid materials stored in the storage vessels 70, 71, and 72 is sent by the pressure of helium (He) gas used as a pressurized gas.

In the semiconductor processing system shown in FIG. 9, a film formation method is performed as follows. Specifically, He gas used as a pressurized gas is supplied into the storage vessels 70, 71, and 72 through the gas supply line 21, so that the liquid materials are sent by pressure to the respective vaporizers 2. In the vaporizers 2, the titanium-based material, strontium-based material, and barium-based material are respectively vaporized to generate corresponding process gases. These process gases are supplied through the gas supply lines 53 into the reaction tube 110 of the film formation section 100. Further, oxygen gas (not shown) is also supplied into the reaction tube 110. At this time, the interior of the reaction tube 110 is set at a predetermined temperature and a predetermined pressure. Consequently, a BST (barium strontium titanium) oxide film is formed on the surface of the wafers W supported on the wafer boat 120 in the reaction tube 110.

The vaporizer 2 supplied with the titanium-based material is set by the corresponding heaters 33 and 48 to have a temperature of, e.g., 200° C. inside the container 40, which is optimum for vaporization of the titanium-based material. The vaporizer 2 supplied with the strontium-based material is set by the corresponding heaters 33 and 48 to have a temperature of, e.g., 300° C. inside the container 40, which is optimum for vaporization of the strontium-based material. The vaporizer 2 supplied with the barium-based material is set by the corresponding heaters 33 and 48 to have a temperature of, e.g., 300° C. inside the container 40, which is optimum for vaporization of the barium-based material. As described above, the containers 40 of the vaporizers 2 are set to have optimum inner temperatures to vaporize the respective liquid materials. Consequently, a plurality of different liquid materials, which have different vapor pressures and thermal decomposition temperatures, can be simultaneously vaporized.

The gas supply system 300 further includes storage vessel 73 that stores tetrahydrofuran (THF) solution used for cleaning the vaporizers 2 and supply lines 51. The storage vessel 73 is connected to a cleaning solution supply line 83 provided with a liquid mass flow meter M4. The supply line 83 has branch lines respectively connected to the supply lines 51 extending from the vaporizers 2 at positions downstream from the liquid mass flow meters M. The supply line 83 further has branch lines respectively connected to the supply lines 51 at positions upstream from the liquid mass flow meters M. These branch lines of the supply line 83 are respectively provided with valves V7 and V8. The storage vessel 73 is also connected to the gas supply line 21 through a valve V9.

When a cleaning process is performed in the semiconductor processing system shown in FIG. 9, He gas used as a pressurized gas is supplied into the storage vessel 73 through the gas supply line 21. With this pressurized gas being supplied, the tetrahydrofuran (THF) solution is sent by pressure from the storage vessel 73 into the vaporizer 2 and supply line 51 to clean up the interior of these members.

As described above, according to this embodiment, a plurality of vaporizers 2 are disposed for respective liquid materials, such as barium, strontium, and titanium-based materials, and the containers 40 of the vaporizers 2 are set to have optimum inner temperatures to vaporize the respective liquid materials. Consequently, a plurality of different liquid materials, which have different vapor pressures and thermal decomposition temperatures, can be simultaneously vaporized, so that the process gases can be simultaneously supplied from the vaporizer 2 into the reaction tube 110 of the film formation section 100.

In contrast to this structure, if a common vaporizer 2 is used for the liquid materials, it is necessary to control the heating temperature of the vaporizer 2 to fall within an overlapped range usable for all the liquid materials, because the liquid materials have there own optimum temperature ranges for vaporization. In this case, not only is the temperature control difficult, but also some of the liquid materials may be deposited as a liquefied substance inside the vaporizer 2, because the vapor pressure becomes lower due to thermal decomposition. Accordingly, as shown in FIG. 9, the vaporizers 2 are preferably disposed for the respective liquid materials.

Figure 10:
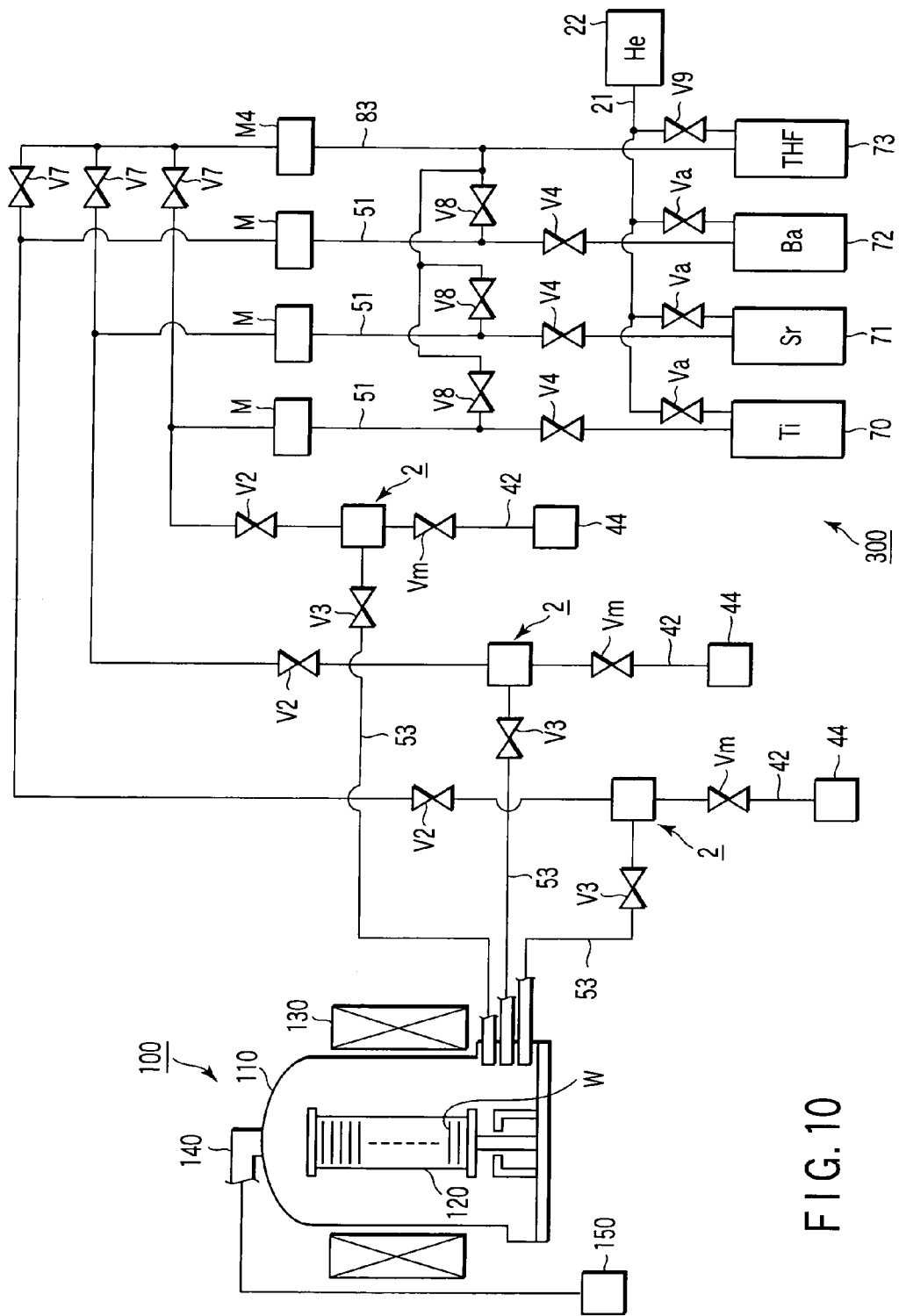
FIG. 10 is a structural view showing a semiconductor processing system (film formation system) according to a modification of the embodiment shown in FIG. 9.

FIG. 10 is a structural view showing a semiconductor processing system (film formation system) according to a modification of the embodiment shown in FIG. 9. In this modification, the gas supply lines 53 extending from the output ports 32 of the vaporizers 2 are directly connected to the reaction tube 110 of the film formation section 100. Accordingly, the different process gases are respectively supplied into the reaction tube 110 without being mixed with each other in advance. This arrangement is preferable in a case where the process gases are respectively and intermittently supplied into the reaction tube 110. The other components of this system are the same as those of the system shown in FIG. 9.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vaporizer for generating a process gas from a liquid material, the vaporizer comprising:
    a container defining a process space of the vaporizer;
    an injector having a spray port configured to spray the liquid material in an atomized state downward in the container;
    a lower block disposed on a bottom of the container below the spray port inside the container such that a run-up space for the atomized liquid material is defined between the spray port and the lower block, and an annular space continuous to the run-up space is defined between the lower block and an inner surface of the container around the lower block, said lower block comprising an upper solid surface extending substantially across the container and configured to expand the atomized liquid material toward the annular space;
    first and second heaters respectively provided to the container and the lower block, and configured to heat the atomized liquid material flowing through the annular space to generate the process gas; and
    a gas delivery passage connected to the container to output the process gas from the annular space,
    wherein the gas delivery passage is configured to laterally output the process gas from the annular space,
    wherein the lower block is a column having a circular or polygonal shape in a cross section and configured to cause the atomized liquid material flowing downward from the injector through the run-up space to be guided around the outermost surface of the lower block into the annular space, and
    wherein the annular space has a shape eccentric relative to a center of the lower block such that a first width on a first side connected to the gas delivery passage is smaller than a second width on a second side opposite the first side to set a ratio of the second width relative to the first width to fall within a range of 3 to 1.5.

2. The vaporizer according to claim 1, further comprising an exhaust passage connected to the container below the gas delivery passage and configured to exhaust drainage liquid.

3. The vaporizer according to claim 2, wherein the exhaust passage is provided with a valve, which is closed to set the exhaust passage as a mist receiver.

4. The vaporizer according to claim 3, wherein the exhaust passage is opened to the bottom of the container on the second side.

5. The vaporizer according to claim 1, wherein the ratio of the second width relative to the first width is set to fall within a range of 2 to 1.5.

6. The vaporizer according to claim 1, wherein a center of the lower block has a circular or polygonal shape in a cross section, and a center of the lower block is offset from a center of the spray port toward the gas delivery passage to set the ratio of the second width relative to the first width.

7. The vaporizer according to claim 1, wherein the injector has a double tube structure formed of inner and outer tubes and configured to supply the liquid material from the inner tube and to supply an atomizing gas from the outer tube.

8. The vaporizer according to claim 1, further comprising a purge gas supply passage connected to the container to supply a purge gas into the process space.

9. The vaporizer according to claim 1, further comprising a cleaning solution supply passage connected to the container to supply a cleaning solution into the process space.

10. The vaporizer according to claim 1, wherein a center of the lower block aligns with a center of the spray port while a sidewall of the container is curved from a position corresponding to a top of the lower block to set the ratio of the second width relative to the first width.

11. The vaporizer according to claim 1, wherein the second heater comprises a resistive heating body included in the lower block.

12. A semiconductor processing system comprising:
    a process chamber configured to accommodate a target substrate;
    a support member configured to support the target substrate inside the process chamber;

a heater configured to heat the target substrate inside the process chamber;

an exhaust system configured to exhaust gas inside the process chamber; and a gas supply system configured to supply a process gas into the process chamber, and including a vaporizer for generating the process gas from a liquid material, wherein the vaporizer comprises a container defining a process space of the vaporizer, an injector having a spray port configured to spray the liquid material in an atomized state downward in the container, a lower block disposed on a bottom of the container below the spray port inside the container such that a run-up space for the atomized liquid material is defined between the spray port and the lower block, and an annular space continuous to the run-up space is defined between the lower block and an inner surface of the container around the lower block, said lower block comprising an upper solid surface extending substantially across the container and configured to expand the atomized liquid material toward the annular space, first and second heaters respectively provided to the container and the lower block, and configured to heat the atomized liquid material flowing through the annular space to generate the process gas, and a gas delivery passage connected to the container to output the process gas from the annular space and configured to receive a sucking force made by the exhaust system, wherein the gas delivery passage is configured to laterally output the process gas from the annular space, wherein the lower block is a column having a circular or polygonal shape in a cross section and configured to cause the atomized liquid material flowing downward from the injector through the run-up space to be guided around the outermost surface of the lower block into the annular space, and wherein the annular space has a shape eccentric relative to a center of the lower block such that a first width on a first side connected to the gas delivery passage is smaller than a second width on a second side opposite the first side to set a ratio of the second width relative to the first width to fall within a range of 3 to 1.5.

13. The system according to claim 12, wherein the vaporizer further comprises an exhaust passage connected to the container below the gas delivery passage and configured to exhaust drainage liquid.

14. The system according to claim 12, wherein a center of the lower block has a circular or polygonal shape in a cross section, and a center of the lower block is offset from a center of the spray port toward the gas delivery passage to set the ratio of the second width relative to the first width.

15. The system according to claim 12, wherein the gas supply system further comprises
  a storage vessel that stores the liquid material and is connected to the vaporizer through a liquid material supply passage, and
  a gas supply unit configured to supply a pressurized gas to the storage vessel, so as to send the liquid material by pressure from the storage vessel to the vaporizer through the liquid material supply passage.

16. The system according to claim 12, wherein the gas supply system is configured to supply a plurality of different process gases into the process chamber, and comprises a plurality of vaporizers to generate the different process gases from a plurality of different liquid materials.

17. The system according to claim 12, wherein the gas supply system is configured to supply, as the process gas, a gas for forming a thin film on the target substrate by CVD.

18. The system according to claim 12, wherein a center of the lower block aligns with a center of the spray port while a sidewall of the container is curved from a position corresponding to a top of the lower block to set the ratio of the second width relative to the first width.

19. The system according to claim 12, wherein the ratio of the second width relative to the first width is set to fall within a range of 2 to 1.5.

20. The system according to claim 12, wherein the exhaust passage is provided with a valve, which is closed to set the exhaust passage as a mist receiver.

21. The system according to claim 20, wherein the exhaust passage is opened to the bottom of the container on the second side.

22. The system according to claim 12, wherein the second heater comprises a resistive heating body included in the lower block.

* * * * *